United States Patent
Hsu et al.

(10) Patent No.: US 9,552,116 B2
(45) Date of Patent: Jan. 24, 2017

(54) TOUCH APPARATUS

(71) Applicant: Chunghwa Picture Tubes, LTD., Taoyuan County (TW)

(72) Inventors: Chao-Yong Hsu, Taoyuan County (TW); Yu-Chen Li, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 120 days.

(21) Appl. No.: 14/559,932

(22) Filed: Dec. 4, 2014

(65) Prior Publication Data

US 2016/0062501 A1 Mar. 3, 2016

(30) Foreign Application Priority Data

Aug. 29, 2014 (TW) .............................. 103129893 A

(51) Int. Cl.
 *G06F 3/041* (2006.01)
 *G06F 3/044* (2006.01)
 *G06F 3/0488* (2013.01)
 *G01R 27/26* (2006.01)

(52) U.S. Cl.
 CPC ............. *G06F 3/044* (2013.01); *G06F 3/0416* (2013.01); *G06F 3/04883* (2013.01); *G01R 27/2605* (2013.01); *G06F 3/041* (2013.01); *G06F 2203/04113* (2013.01)

(58) Field of Classification Search
 CPC ...... G06F 3/041; G06F 3/044; G01R 27/2605; G01R 29/26; H03K 2017/9602; H03K 2217/960705
 See application file for complete search history.

(56) References Cited

U.S. PATENT DOCUMENTS

| 8,390,587 | B2 | 3/2013 | Fan et al. | |
| 8,586,874 | B2 | 11/2013 | Kuriki | |
| 2005/0073324 | A1* | 4/2005 | Umeda | G01R 27/2605 324/662 |
| 2005/0146513 | A1* | 7/2005 | Hill | G06F 3/043 345/173 |
| 2006/0097991 | A1* | 5/2006 | Hotelling | G06F 3/0416 345/173 |

(Continued)

FOREIGN PATENT DOCUMENTS

| CN | 101593068 | 7/2011 |
| JP | S63301316 | 12/1988 |
| TW | 201351245 | 12/2013 |

OTHER PUBLICATIONS

"Office Action of Taiwan Counterpart Application," issued on Feb. 2, 2016, p. 1-p. 11.

*Primary Examiner* — Michael J Eurice
(74) *Attorney, Agent, or Firm* — Jianq Chyun IP Office

(57) ABSTRACT

A touch apparatus includes a substrate, a plurality of first sensing electrodes, a plurality of second sensing electrodes, a plurality of third sensing electrodes, a plurality of fourth sensing electrodes, a switch module and a control unit. The switch module is electrically connected with the first sensing electrodes, the second sensing electrodes, the third sensing electrodes and the fourth sensing electrodes. The control unit is electrically connected with the switch module. The touch apparatus decide the connection mode of the switch module according to the touch strength of a touch point on the touch apparatus.

4 Claims, 8 Drawing Sheets

(56) References Cited

U.S. PATENT DOCUMENTS

| | | | | | |
|---|---|---|---|---|---|
| 2007/0229468 | A1* | 10/2007 | Peng | G06F 3/044 | 345/173 |
| 2008/0062139 | A1* | 3/2008 | Hotelling | G02F 1/13338 | 345/173 |
| 2008/0122798 | A1* | 5/2008 | Koshiyama | G06F 3/0412 | 345/173 |
| 2008/0309625 | A1* | 12/2008 | Krah | G06F 3/041 | 345/173 |
| 2009/0115740 | A1* | 5/2009 | Ningrat | G06F 3/0416 | 345/173 |
| 2009/0127005 | A1* | 5/2009 | Zachut | G06F 3/044 | 178/18.03 |
| 2010/0053097 | A1* | 3/2010 | Goh | G06F 3/0416 | 345/173 |
| 2010/0328249 | A1* | 12/2010 | Ningrat | G06F 3/046 | 345/174 |
| 2011/0042152 | A1* | 2/2011 | Wu | G06F 3/0416 | 178/18.03 |
| 2011/0153263 | A1* | 6/2011 | Oda | G06F 3/03545 | 702/150 |
| 2011/0181523 | A1* | 7/2011 | Grothe | G06F 3/0418 | 345/173 |
| 2013/0063388 | A1* | 3/2013 | Ningrat | G06F 3/044 | 345/174 |
| 2013/0181937 | A1* | 7/2013 | Chen | G06F 3/044 | 345/174 |
| 2013/0307820 | A1* | 11/2013 | Kim | G06F 3/0412 | 345/174 |
| 2014/0104510 | A1* | 4/2014 | Wang | G06F 3/0412 | 349/12 |
| 2014/0132541 | A1* | 5/2014 | Miyamoto | G06F 3/041 | 345/173 |
| 2014/0253508 | A1* | 9/2014 | Yumoto | G06F 3/044 | 345/174 |
| 2014/0267129 | A1* | 9/2014 | Rebeschi | G06F 3/0418 | 345/174 |
| 2014/0354572 | A1* | 12/2014 | Zhao | G06F 3/0416 | 345/173 |
| 2015/0030217 | A1* | 1/2015 | Wickboldt | G06K 9/00026 | 382/124 |
| 2015/0242041 | A1* | 8/2015 | Sugita | G06F 3/044 | 345/174 |
| 2015/0338952 | A1* | 11/2015 | Shahparnia | G06F 3/0418 | 345/174 |

* cited by examiner

When a touch action is not yet performed on the touch apparatus, the switch module electrically connects the control unit with the first sensing electrodes, the second sensing electrodes, the third sensing electrodes and the fourth sensing electrodes ~S100

When a conductive object approaches or contacts the first sensing electrodes, the second sensing electrodes, the third sensing electrodes and the fourth sensing electrodes of the touch apparatus, and a touch strength of a touch point is smaller than a preset value, then the switch module electrically connects the control units with the first sensing electrodes, the second sensing electrodes, the third sensing electrodes and the fourth sensing electrodes ~S110

FIG. 1B

TOUCH APPARATUS

CROSS-REFERENCE TO RELATED APPLICATION

This application claims the priority benefit of Taiwan application serial no. 103129893, filed on Aug. 29, 2014. The entirety of the above-mentioned patent application is hereby incorporated by reference herein and made a part of this specification.

BACKGROUND OF THE INVENTION

1. Field of the Invention

The present invention generally relates to a sensing apparatus, and more particularly, to a touch apparatus.

2. Description of Related Art

Based on different ways of sensing, touch panels are generally categorized into resistant touch panels, capacitive touch panels, optical touch panels, sonic wave touch panels, and electromagnetic touch panels. The capacitive touch panels due to having advantages of fast response speed, favorable reliability, and high durability are extensively being applied in electronic devices.

The capacitive touch panel is being operated through using a conductive object, such as a finger or a stylus, to approach or contact the touch panel, so as to change a capacitance on the touch panel. When a change in the capacitance is being detected, coordinates of a touch point at where the conductive object approaches or contacts the touch panel can be located, and thereby executes functions corresponded to the coordinates of the touch point.

However, based on different touch operation mediums (finger, stylus, etc.) or touch operations (approaching or contacting), touch strengths detected by the touch panel may be different, and thereby may affect the accuracy in determining touch coordinates. Therefore, it is imperative to attain a favorable effect in determining the touch coordinates under the use of different touch operation mediums or touch operations.

SUMMARY OF THE INVENTION

The invention is directed to a touch apparatus capable of attaining a favorable effect in determining touch coordinates.

The touch apparatus of the invention includes a substrate, a plurality of first sensing electrodes, a plurality of second sensing electrodes, a plurality of third sensing electrodes, a plurality of fourth sensing electrodes, a switch module and a control unit. The first sensing electrodes and the third sensing electrodes are extendedly disposed on the substrate along a first direction. The first sensing electrodes and the third sensing electrodes are staggeredly disposed with each other. The second sensing electrodes and the fourth sensing electrodes are extendedly disposed on the substrate along a second direction. The second sensing electrodes and the fourth sensing electrodes are staggeredly disposed with each other. The first direction and the second direction intersect each other. The switch module is electrically connected with the first sensing electrodes, the second sensing electrodes, the third sensing electrodes and the fourth sensing electrodes. The control unit is electrically connected with the switch module, so as to control the switch module. The control unit selectively connects with the first sensing electrodes, the second sensing electrodes, the third sensing electrodes and the fourth sensing electrodes electrically through the switch module. The touch apparatus decides a connection mode of the switch module through sensing the touch strength of a touch point on the touch apparatus, wherein when the touch strength of the touch point is greater than a preset value, the switch module electrically connects the control unit to the first sensing electrodes and the second sensing electrodes, and the switch module disconnects the control unit from the third sensing electrodes and the fourth sensing electrodes.

The touch apparatus of the invention includes a substrate, a plurality of first sensing electrodes, a plurality of second sensing electrodes, a plurality of third sensing electrodes, a plurality of fourth sensing electrodes, a switch module and a control unit. The first sensing electrodes and the third sensing electrodes are extendedly disposed on the substrate along a first direction. The first sensing electrodes and the third sensing electrodes are staggeredly disposed with each other. The second sensing electrodes and the fourth sensing electrodes are extendedly disposed on the substrate along a second direction. The second sensing electrodes and the fourth sensing electrodes are staggeredly disposed with each other. The first direction and the second direction intersect each other. The switch module is electrically connected with the first sensing electrodes, the second sensing electrodes, the third sensing electrodes and the fourth sensing electrodes. The control unit is electrically connected with the switch module, so as to control the switch module. The control unit selectively connects with the first sensing electrodes, the second sensing electrodes, the third sensing electrodes and the fourth sensing electrodes electrically through the switch module. The touch apparatus decides a connection mode of the switch module through sensing the touch strength of a touch point on the touch apparatus, wherein when the touch strength of the touch point is smaller than a preset value, the switch module electrically connects the control unit to the first sensing electrodes, the second sensing electrodes, the third sensing electrodes and the fourth sensing electrodes.

The touch apparatus of the invention includes a substrate, a plurality of first sensing electrodes, a plurality of second sensing electrodes, a plurality of third sensing electrodes, a plurality of fourth sensing electrodes, a switch module and a control unit. The first sensing electrodes and the third sensing electrodes are extendedly disposed on the substrate along a first direction. The first sensing electrodes and the third sensing electrodes are staggeredly disposed with each other. The second sensing electrodes and the fourth sensing electrodes are extendedly disposed on the substrate along a second direction. The second sensing electrodes and the fourth sensing electrodes are staggeredly disposed with each other. The first direction and the second direction intersect each other. The switch module is electrically connected with the first sensing electrodes, the second sensing electrodes, the third sensing electrodes and the fourth sensing electrodes. The control unit is electrically connected with the switch module, so as to control the switch module. The control unit selectively connects with the first sensing electrodes, the second sensing electrodes, the third sensing electrodes and the fourth sensing electrodes electrically through the switch module. The switch module includes a plurality of first switches, a plurality of second switches, a plurality of third switches, a plurality of fourth switches, a plurality of fifth switches and a plurality of sixth switches. The first switches are between the control unit and the first sensing electrodes. The second switches are between the control unit and the second sensing electrodes. The third switches are between the control unit and the third sensing electrodes. The fourth switches are between the control unit and the fourth sensing electrodes. The fifth switches are between the first sensing electrodes and the corresponding third sensing electrodes. The sixth switches are between the second sensing electrodes and the corresponding fourth sensing electrodes. The touch apparatus decides a connection mode of the switch module through sensing the touch strength of a touch point on the touch apparatus, wherein when the touch strength of the touch point is smaller than a preset value, the switch module electrically connects the control unit to the first sensing electrodes through the first switches, to the second sensing electrodes through the second switches, to the third sensing electrodes through the third switches, and to the fourth sensing electrodes through the fourth switches. Afterward, if the touch strength of the touch point is still smaller than the preset value, then the corresponding third sensing electrodes of each of the first sensing electrodes are electrically connected with the control unit through each of the first switches and each of the fifth switches, and the corresponding fourth sensing electrodes of each of the second sensing electrodes are electrically connected with the control unit through each of the second switches and each of the sixth switches.

The touch apparatus of the invention includes a substrate, a plurality of first sensing electrodes, a plurality of second sensing electrodes, a plurality of third sensing electrodes, a plurality of fourth sensing electrodes, a switch module and a control unit. The first sensing electrodes and the third sensing electrodes are extendedly disposed on the substrate along a first direction. The first sensing electrodes and the third sensing electrodes are staggeredly disposed with each other. The second sensing electrodes and the fourth sensing electrodes are extendedly disposed on the substrate along a second direction. The second sensing electrodes and the fourth sensing electrodes are staggeredly disposed with each other. The first direction and the second direction intersect each other. The switch module is electrically connected with the first sensing electrodes, the second sensing electrodes, the third sensing electrodes and the fourth sensing electrodes. The control unit is electrically connected with the switch module, so as to control the switch module. The control unit selectively connects with the first sensing electrodes, the second sensing electrodes, the third sensing electrodes and the fourth sensing electrodes electrically through the switch module. The switch module includes a plurality of first switches, a plurality of second switches, a plurality of third switches, a plurality of fourth switches, and a plurality of fifth switches. The first switches are between the control unit and the first sensing electrodes. The second switches are between the control unit and the second sensing electrodes. The third switches are between the control unit and the third sensing electrodes. The fourth switches are between the control unit and the fourth sensing electrodes. The fifth switches are between the first sensing electrodes and the corresponding third sensing electrodes. The touch apparatus decides a connection mode of the switch module through sensing the touch strength of a touch point on the touch apparatus, wherein when the touch strength of the touch point is smaller than a preset value, the switch module electrically connects the control unit to the first sensing electrodes through the first switches, to the second sensing electrodes through the second switches, to the third sensing electrodes through the third switches, and to the fourth sensing electrodes through the fourth switches. Afterwards, if the touch strength of the touch point is still smaller than the preset value and a signal-to-noise ratio is required to be increased, then the corresponding third sensing electrodes of each of the first sensing electrodes are electrically connected with the control unit through each of the first switches and each of the fifth switches, the control unit is electrically connected with the second sensing electrodes through the second switches, and the control unit is electrically connected with the fourth sensing electrodes through the fourth switches.

In view of the foregoing, in the touch apparatus of the invention, the connection mode of the switch module is decided according to the touch strength of the touch point being sensed on the touch apparatus, and thus the touch apparatus is capable of attaining a favorable effect in determining the touch coordinates.

To make the aforementioned and other features and advantages of the application more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B shows a sensing method suitable for the touch apparatus depicted in FIG. 1A.

DESCRIPTION OF THE EMBODIMENTS

Figure 1A:
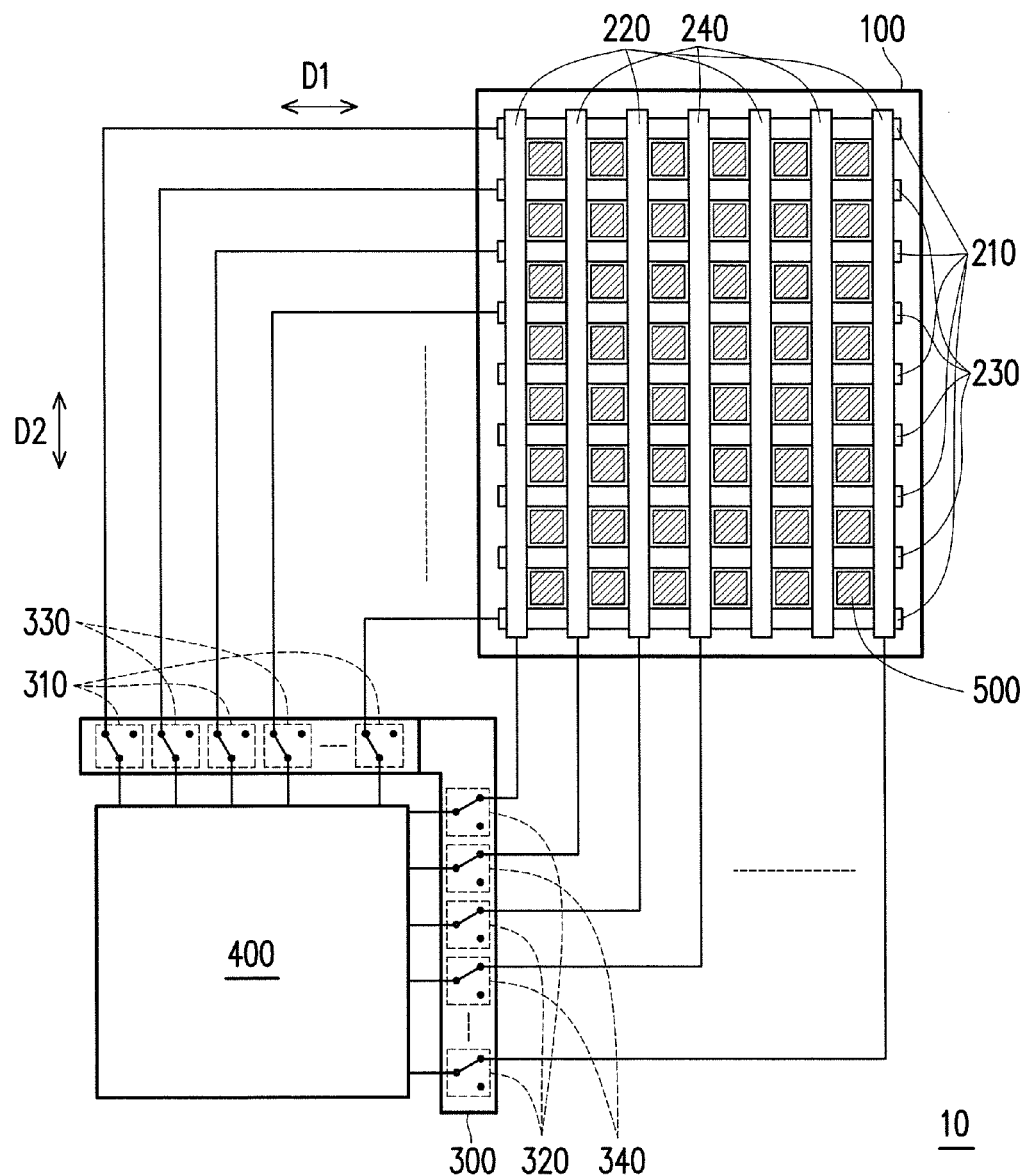
FIG. 1A is a schematic diagram illustrating a touch apparatus according to a first embodiment of the invention.

FIG. 1A is a schematic diagram illustrating a touch apparatus 10 according to a first embodiment of the invention. Referring to FIG. 1A, the touch apparatus 10 of the present embodiment includes a substrate 100, a plurality of first sensing electrodes 210, a plurality of second sensing electrodes 220, a plurality of third sensing electrodes 230, a plurality of fourth sensing electrodes 240, a switch module 300 and a control unit 400.

In detail, the first sensing electrodes 210 and the third sensing electrodes 230 are extendedly disposed on the substrate 100 along a first direction D1, and the first sensing electrodes 210 and the third sensing electrodes 230 are staggeredly disposed with each other. The second sensing electrodes 220 and the fourth sensing electrodes 240 are extendedly disposed on the substrate 100 along a second direction D2, and the second sensing electrodes 220 and the fourth sensing electrodes 240 are staggeredly disposed with each other. The first direction D1 and the second direction D2 intersect each other. Hence, through sensing capacitance changes (mutual capacitance) between the first sensing electrodes 210, the third sensing electrodes 230, the second sensing electrodes 220 and the fourth sensing electrodes 240, or through sensing the respective capacitance changes (self-capacitance) in each of the first sensing electrodes 210, in each of the second sensing electrodes 220, in each of the third sensing electrodes 230 and in each of the fourth sensing electrodes 240, the touch apparatus 10 may locate the coordinates whereby a conductive object approaches or contacts the touch apparatus 10.

It is to be noted that, shapes and amounts of the first sensing electrodes 210, the second sensing electrodes 220, the third sensing electrodes 230 and the fourth sensing electrodes 240 as shown in FIG. 1A are only provided for demonstration purpose, such that the invention is not limited thereto. In the following below, for convenience of illustration, the first sensing electrodes 210, the second sensing electrodes 220, the third sensing electrodes 230 and the fourth sensing electrodes 240 are all being represented by long-strips, and the amounts thereof may be clearly identified in the figures.

The switch module 300 is electrically connected with the first sensing electrodes 210, the second sensing electrodes 220, the third sensing electrodes 230 and the fourth sensing electrodes 240. The control unit 400 is electrically connected with the switch module 300 for controlling the switch module 300. In other words, the control unit 400 is selectively connected with the first sensing electrodes 210, the second sensing electrodes 220, the third sensing electrodes 230 and the fourth sensing electrodes 240 electrically through the switch module 300. Specifically, the switch module 300 includes a plurality of first switches 310, a plurality of second switches 320, a plurality of third switches 330 and a plurality of fourth switches 340. The first switches 310 are between the control unit 400 and the first sensing electrodes 210, the second switches 320 are between the control unit 400 and the second sensing electrodes 220, the third switches 330 are between the control unit 400 and the third sensing electrodes 230, and the fourth switches 340 are between the control unit 400 and the fourth sensing electrodes 240. As such, the control unit 400 may selectively be connected with the first sensing electrodes 210, the second sensing electrodes 220, the third sensing electrodes 230 and the fourth sensing electrodes 240 electrically through switching the first switches 310, the second switches 320, the third switches 330 and the fourth switches 340 in the switch module 300.

For convenience of illustration, the first switches 310, the second switches 320, the third switches 330 and the fourth switches 340 as shown in FIG. 1A are all being represented by simple switch icons, which may be shown in connected or disconnected states. In addition, the first switches 310, the second switches 320, the third switches 330 and the fourth switches 340 may be integrated with the control unit 400 into an integrated circuit (IC), thereby reducing an area of use on a circuit board and also lowering an amount of electronic components being used, but the invention is not limited thereto. The first switches 310, the second switches 320, the third switches 330, the fourth switches 340 and the control unit 400 may also be disposed on the substrate 100, or be disposed in any manner satisfying the conditions of: the first switches 310 being between the control unit 400 and the first sensing electrodes 210, the second switches 320 being between the control unit 400 and the second sensing electrodes 220, the third switches 330 being between the control unit 400 and the third sensing electrodes 230, and the fourth switches 340 being between the control unit 400 and fourth sensing electrodes 240; details will not be repeated herein.

In addition to the above, the touch apparatus 10 may further include a plurality of compensation patterns 500, and each of the compensation patterns 500 is disposed on the substrate 100 and located in a region not being disposed with and surrounded by the first sensing electrodes 210, the second sensing electrodes 220, the third sensing electrodes 230 and the fourth sensing electrodes 240. The compensation patterns 500 may be used as optical compensations for the touch apparatus 10, so as to prevent an uneven visual effect from being caused by the configurations of the first sensing electrodes 210, the second sensing electrodes 220, the third sensing electrodes 230 and the fourth sensing electrodes 240 on the substrate 100 of the touch panel 10. Particularly, the compensation patterns 500 may be made of a same material as the first sensing electrodes 210, the second sensing electrodes 220, the third sensing electrodes 230 and the fourth sensing electrodes 240, which is, for instance, a transparent conductive material, and thereby achieves a uniform visual effect under a condition of not requiring any additional processing.

On the other hand, FIG. 1B shows a sensing method suitable for the touch apparatus depicted in FIG. 1A. Referring to FIG. 1A and FIG. 1B, in general, when a touch action is not yet performed on the touch apparatus 10, such as in step S100, the switch module 300 electrically connects the control unit 400 to the first sensing electrodes 210, the second sensing electrodes 220, the third sensing electrodes 230 and the fourth sensing electrodes 240. In the present embodiment, when the touch action is performed on the touch apparatus 10, such as when the conductive object approaches or contacts the first sensing electrodes 210, the second sensing electrodes 220, the third sensing electrodes 230 and the fourth sensing electrodes 240 of the touch apparatus 10, a touch strength of a touch point on the touch apparatus 10 may be determined through sensing the capacitance changes between the first sensing electrodes 210, the third sensing electrodes 230, the second sensing electrodes 220 and the fourth sensing electrodes 240, or through sensing the respective capacitance changes in each of the first sensing electrodes 210, in each of the second sensing electrodes 220, in each of the third sensing electrodes 230 and in each of the fourth sensing electrodes 240, and thus a connection mode of the switch module 300 may be decided according to the touch strength of the touch point on the touch apparatus 10.

Next, the touch strength of the touch point in comparison to a preset value is being determined. When the touch strength of the touch point is smaller than the preset value, such as in step S110, the switch module 300 electrically connects the control unit 400 with the first sensing electrodes 210, the second sensing electrodes 220, the third sensing electrodes 230 and the fourth sensing electrodes 240. It is to be noted that, the touch strength is related to a contact area between the touch point and the touch apparatus 10, and is determined by the capacitance changes in the first sensing electrodes 210, the second sensing electrodes 220, the third sensing electrodes 230 and the fourth sensing electrodes 240 when the touch point is being sensed, and thus a user may adjust the magnitude of the preset value according to the calculation method and the sensing ability of the control unit 400. Certainly, in terms of a touch apparatus adopting floating touch technology, the touch strength may also be related to an area of a portion whereby a distance between the touch point and the touch apparatus is less than a preset distance.

For instance, in the touch apparatus 10, a spacing between the first sensing electrodes 210 and the third sensing electrodes 230 that are staggeredly disposed with each other along a first direction D1 may be designed to range from 2 μm to 3.5 μm, and a spacing between the second sensing electrodes 220 and the fourth sensing electrodes 240 that are staggeredly disposed with each other along a second direction D2 may be designed to range from 2 μm to 3.5 μm. Therefore, when using a conductive object, such as a stylus, to approach or contact the first sensing electrodes 210, the second sensing electrodes 220, the third sensing electrodes 230 and the fourth sensing electrodes 240 of the touch apparatus 10, and now, assuming an area of a touch point formed on the touch apparatus 10 being smaller than a preset area, while the control unit 400 sensed that the capacitance changes in the first sensing electrodes 210, the second sensing electrodes 220, the third sensing electrodes 230 and the fourth sensing electrodes 240 are smaller than a preset value, then the switch module 300 electrically connects the control unit 400 with the first sensing electrodes 210, the second sensing electrodes 220, the third sensing electrodes 230 and the fourth sensing electrodes 240. In this way, a favorable effect in determining touch coordinates may be attained through using a larger amount of the sensing electrodes.

Figure 2A:
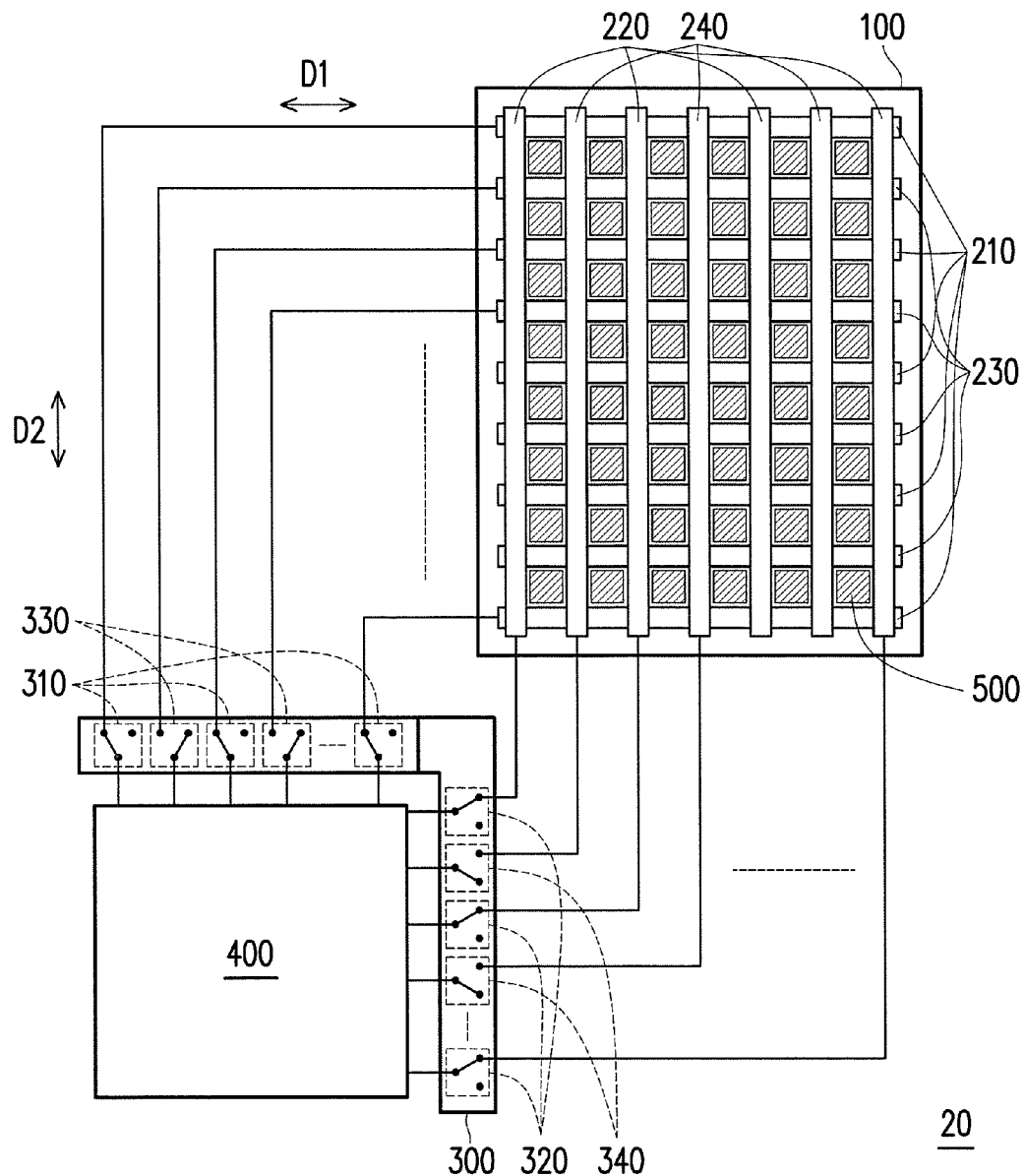
FIG. 2A is a schematic diagram illustrating a touch apparatus according to a second embodiment of the invention.

FIG. 2A is a schematic diagram illustrating a touch apparatus 20 according to a second embodiment of the invention. Referring to FIG. 2A, in the present embodiment, the touch panel 20 is similar to the touch panel 10 of FIG. 1A, and thus similar components thereof are indicated with the same reference numerals and have similar functions, and no further detail will be elaborated herein. A main difference between the touch panel 20 and the touch panel 10 lies in that, the switch module 300 electrically connects the control unit 400 with the first sensing electrodes 210 and the second sensing electrodes 220; in other words, the control unit 400 is disconnected from and not electrically connected with the third sensing electrodes 230 and the fourth sensing electrodes 240.

In detail, in the present embodiment, the control unit 400 is electrically connected with the first sensing electrodes 210 through the first switches 310, and the control unit 400 is electrically connected with the second sensing electrodes 220 through the second switches 320. On the other hand, the third sensing electrodes 230 are not electrically connected with the control unit 400 through the third switches 330, and the fourth sensing electrodes 240 are not electrically connected with the control unit 400 through the fourth switches 340. As a result, the control unit 400 of the touch apparatus 20 locates the coordinates whereby the conductive object approaches or contacts the touch apparatus 20 through capacitance changes between the first sensing electrodes 210 and the second sensing electrodes 220, or through the respective capacitance changes in each of the first sensing electrodes 210 and in each of the second sensing electrodes 220. In this way, the amount of sensing electrodes being used may be reduced, and thereby lowers the number and the time for performing the calculation.

Figure 2B:
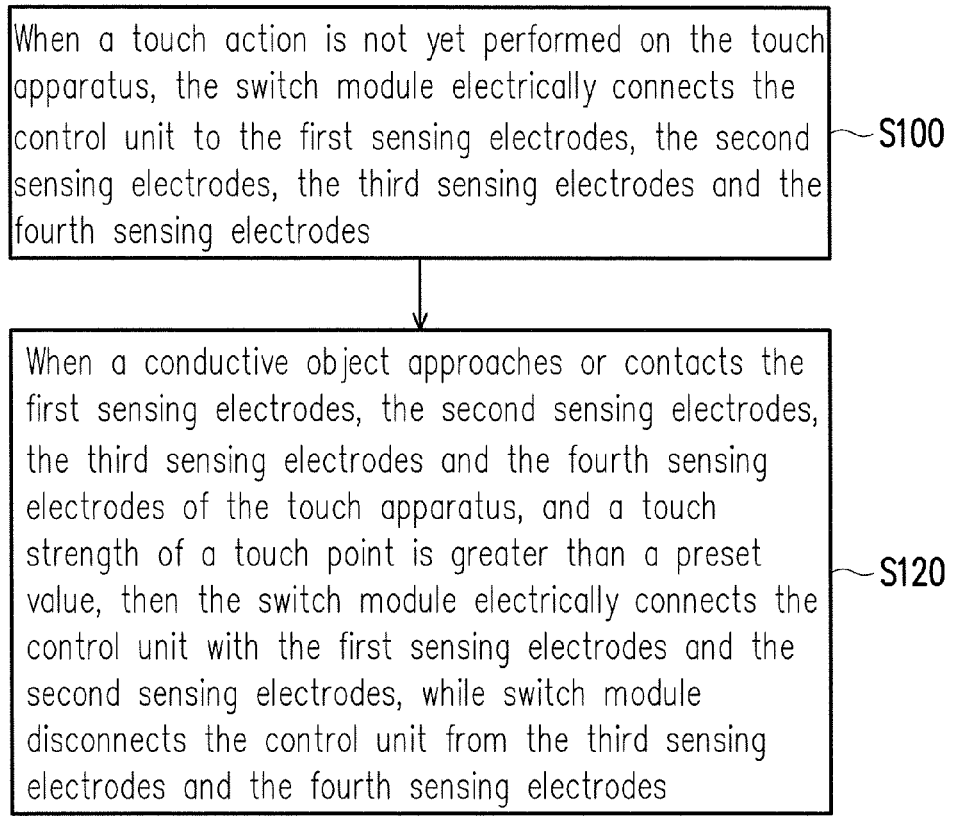
FIG. 2B shows a sensing method suitable for the touch apparatus depicted in FIG. 2A.

On the other hand, FIG. 2B shows a sensing method suitable for the touch apparatus depicted in FIG. 2A. Referring to FIG. 2A and FIG. 2B, in general, when a touch action is not yet performed on the touch apparatus 10, such as in step S100, the switch module 300 electrically connects the control unit 400 with the first sensing electrodes 210, the second sensing electrodes 220, the third sensing electrodes 230 and the fourth sensing electrodes 240. In the present embodiment, when the touch action is performed on the touch apparatus 20, such as when the conductive object approaches or contacts the touch apparatus 20, a touch strength of a touch point on the touch apparatus 20 may be determined through sensing the capacitance changes between the first sensing electrodes 210, the third sensing electrodes 230, the second sensing electrodes 220 and the fourth sensing electrodes 240, or through sensing the respective capacitance changes in each of the first sensing electrodes 210, in each of the second sensing electrodes 220, in each of the third sensing electrodes 230 and in each of the fourth sensing electrodes 240, and thus a connection mode of the switch module 300 may be decided according to the touch strength of the touch point on the touch apparatus 10. Then, the touch strength of the touch point in comparison to a preset value is being determined. When the touch strength of the touch point is greater than the preset value, such as in step S120, the switch module 300 electrically connects the control unit 400 with the first sensing electrodes 210 and the second sensing electrodes 220, and the switch module 300 disconnects the control unit 400 from the third sensing electrodes 230 and the fourth sensing electrodes 240.

For instance, in the touch apparatus touch apparatus 20, a spacing between the first sensing electrodes 210 and the third sensing electrodes 230 that are staggeredly disposed with each other along a first direction D1 may be designed to range from 2 μm to 3.5 μm, and a spacing between the second sensing electrodes 220 and the fourth sensing electrodes 240 that are staggeredly disposed with each other along a second direction D2 may be designed to range from 2 μm to 3.5 μm. Therefore, when using a conductive object, such as a finger, to approach or contact the first sensing electrodes 210, the second sensing electrodes 220, the third sensing electrodes 230 and the fourth sensing electrodes 240 of the touch apparatus 20, and now, assuming an area of a touch point formed on the touch apparatus 20 being greater than a preset area, while the control unit 400 having sensed that the capacitance changes in the first sensing electrodes 210, the second sensing electrodes 220, the third sensing electrodes 230 and the fourth sensing electrodes 240 are greater than a preset value, then the switch module 300 electrically connects the control unit 400 with the first sensing electrodes 210 and the second sensing electrodes 220, and the switch module 300 disconnects the control unit 400 from the third sensing electrodes 230 and the fourth sensing electrodes 240. In this way, a favorable effect in determining touch coordinates may still be attained through using a less amount of the sensing electrodes.

Figure 3A:
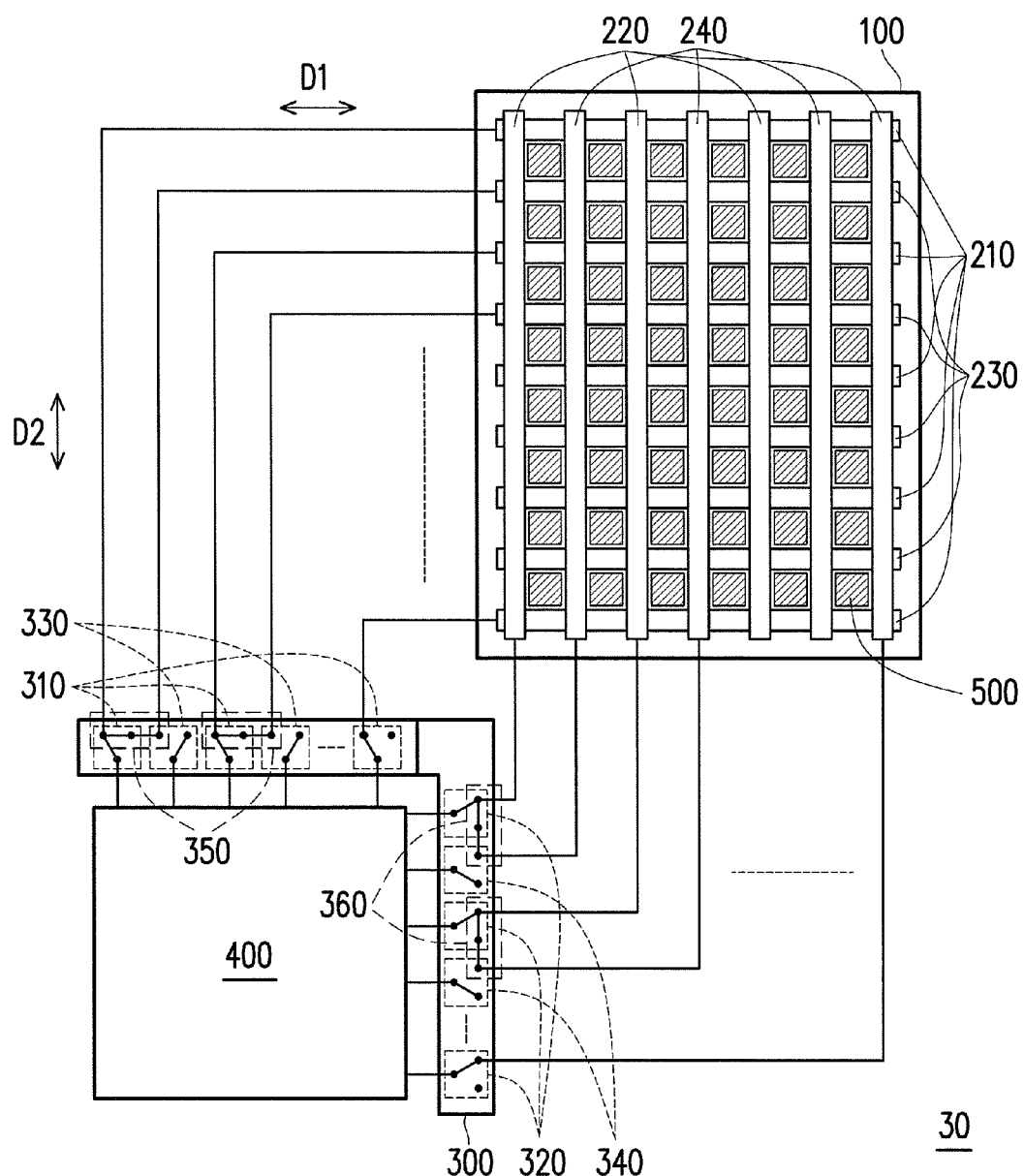
FIG. 3A is a schematic diagram illustrating a touch apparatus according to a third embodiment of the invention.

FIG. 3A is a schematic diagram illustrating a touch apparatus 30 according to a third embodiment of the invention. Referring to FIG. 3A, in the present embodiment, the touch panel 30 is similar to the touch panel 10 of FIG. 1A, and thus similar components thereof are indicated with the same reference numerals and have similar functions, and no further detail will be elaborated herein. A main difference between the touch panel 30 and the touch panel 10 lies in that, the switch module 300 further includes a plurality of fifth switches 350 and a plurality of sixth switches 360. The control unit 400 is electrically connected with the first sensing electrodes 210 through the first switches 310, and the first sensing electrodes 210 may be electrically connected with the corresponding third sensing electrodes 230 through the fifth switches 350. The control unit 400 is electrically connected with the second sensing electrodes 220 through the second switches 320, and the second sensing electrodes 220 may be electrically connected with the corresponding fourth sensing electrodes 240 through the sixth switches 360.

In detail, in the present embodiment, the control unit 400 is electrically connected with the first sensing electrodes 210 through the first switches 310, and each of the first sensing electrodes 210 is electrically connected with one of the third sensing electrodes 230 adjacent thereto through one of the fifth switches 350. The control unit 400 is electrically connected with the second sensing electrodes 220 through the second switches 320, and each of the second sensing electrodes 220 is electrically connected with one of the fourth sensing electrodes 240 adjacent thereto through one of the sixth switches 360. On the other hand, the third sensing electrodes 230 are not electrically connected with the control unit 400 through the third switches 330, and the fourth sensing electrodes 240 are not electrically connected with the control unit 400 through the fourth switches 340. As a result, with the configuration between the first switches 310 and the fifth switches 350 and the configuration between the second switches 320 and the sixth switches 360, the control unit 400 of the touch apparatus 30 may locate the coordinates whereby the conductive object approaches or contacts the touch apparatus 30 through capacitance changes between the first sensing electrodes 210 and one of the third sensing electrodes 230 adjacent thereto and the second sensing electrodes 220 and one of the fourth sensing electrodes 240 adjacent thereto. Otherwise, the control unit 400 of the touch apparatus 30 may locate the coordinates whereby the conductive object approaches or contacts the touch apparatus 30 through the respective capacitance changes in each of the first sensing electrodes 210 and one of the third sensing electrodes 230 adjacent thereto, and in each of the second sensing electrodes 220 and one of the fourth sensing electrodes 240 adjacent thereto.

Figure 3B:
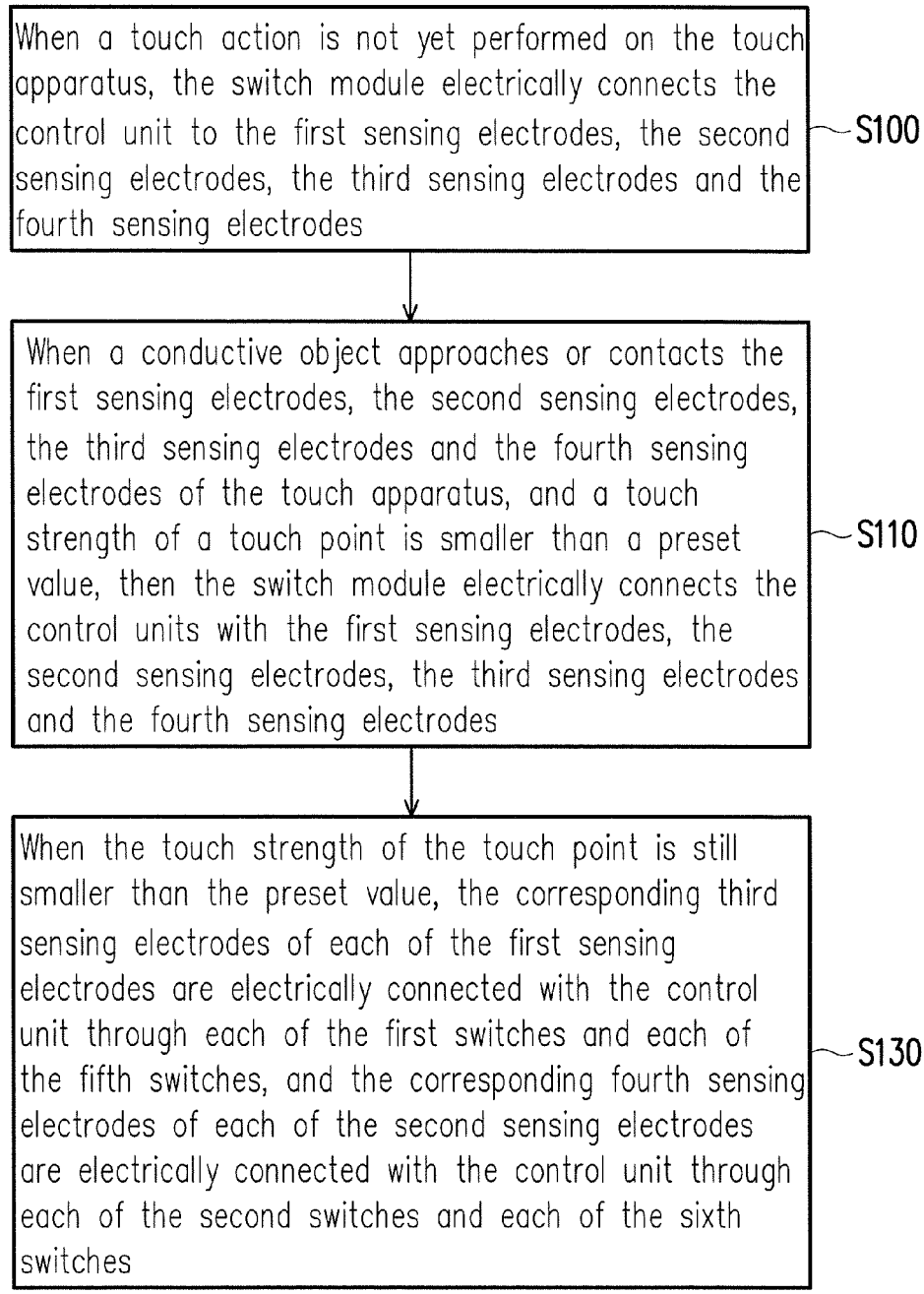
FIG. 3B shows a sensing method suitable for the touch apparatus depicted in FIG. 3A.

On the other hand, FIG. 3B shows a sensing method suitable for the touch apparatus depicted in FIG. 3A. Referring to FIG. 3A and FIG. 3B, in general, when a touch action is not yet performed on the touch apparatus 30, such as in step S100, the switch module 300 electrically connects the control unit 400 with the first sensing electrodes 210, the second sensing electrodes 220, the third sensing electrodes 230 and the fourth sensing electrodes 240. In the present embodiment, when the touch action is performed on the touch apparatus 30, such as when the conductive object approaches or contacts the first sensing electrodes 210, the second sensing electrodes 220, the third sensing electrodes 230 and the fourth sensing electrodes 240 of the touch apparatus 30, a touch strength of a touch point on the touch apparatus 30 may be determined through sensing the capacitance changes between the first sensing electrodes 210, the third sensing electrodes 230, the second sensing electrodes 220 and the fourth sensing electrodes 240, or through sensing the respective capacitance changes in each of the first sensing electrodes 210, in each of the second sensing electrodes 220, in each of the third sensing electrodes 230 and in each of the fourth sensing electrodes 240. Next, the touch strength of the touch point in comparison to a preset value is being determined. When the touch strength of the touch point is smaller than the preset value, such as in step S110, the switch module 300 electrically connects the control unit 400 with the first sensing electrodes 210, the second sensing electrodes 220, the third sensing electrodes 230 and the fourth sensing electrodes 240. And, if under the above condition, the touch strength of the touch point is still smaller than the preset value, such as in step S130, then the switch module 300 electrically connects the corresponding third sensing electrodes 230 of each of the first sensing electrodes 210 with the control unit 400 through each of the first switches 310 and each of the fifth switches 350, and electrically connects the corresponding fourth sensing electrodes 240 of each of the second sensing electrodes 220 with control unit 400 through each of the second switches 320 and each of the sixth switches 360.

For instance, in the touch apparatus 30, a spacing between the first sensing electrodes 210 and the third sensing electrodes 230 that are staggeredly disposed with each other along a first direction D1 may be designed to range from 2 µm to 3.5 µm, and a spacing between the second sensing electrodes 220 and the fourth sensing electrodes 240 that are staggeredly disposed with each other along a second direction D2 may be designed to range from 2 µm to 3.5 µm. Therefore, when using a conductive object, such as a finger in a glove, to approach or contact the first sensing electrodes 210, the second sensing electrodes 220, the third sensing electrodes 230 and the fourth sensing electrodes 240 of the touch apparatus 30, and now, assuming an area of a touch point formed on the touch apparatus 30 being greater than a preset area, while the control unit 400 sensed that the capacitance changes in the first sensing electrodes 210, the second sensing electrodes 220, the third sensing electrodes 230 and the fourth sensing electrodes 240 are smaller than a preset value, then the switch module 300 electrically connects the control unit 400 with the first sensing electrodes 210 and the second sensing electrodes 220, one of the adjacent third sensing electrodes 230 of each of the first sensing electrodes 210 is electrically connected with the control unit 400 through each of the first switches 310 and each of the fifth switches 350, and one of the adjacent fourth sensing electrodes 240 of each of the second sensing electrodes 220 is electrically connected with the control unit 400 through each of the second switches 320 and each of the sixth switches 360, thereby attaining a favorable effect in determining touch coordinates.

Figure 4A:
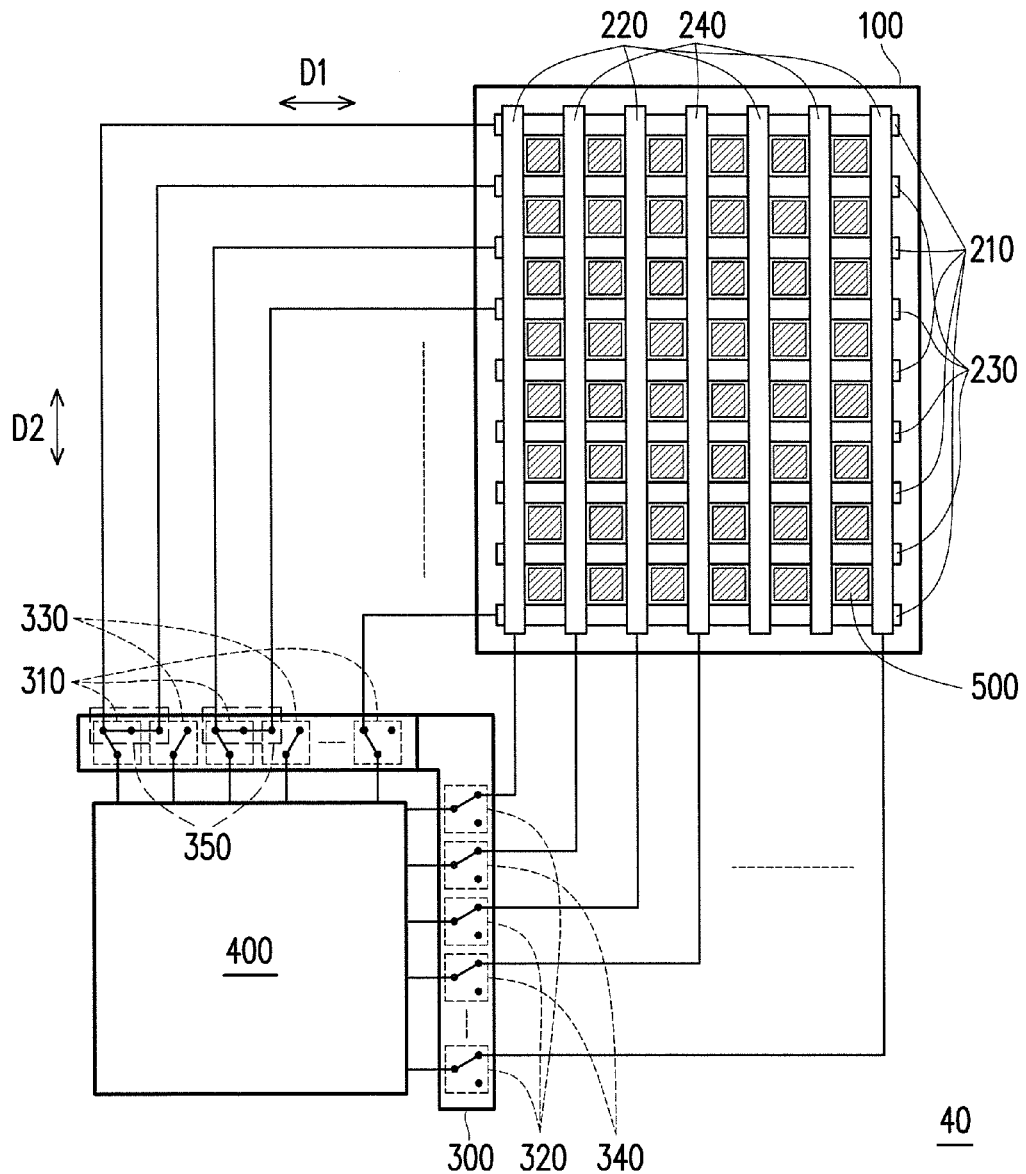
FIG. 4A is a schematic diagram illustrating a touch apparatus according to a fourth embodiment of the invention.

FIG. 4A is a schematic diagram illustrating a touch apparatus 40 according to a fourth embodiment of the invention. Referring to FIG. 4A, in the present embodiment, the touch panel 40 is similar to the touch panel 30 of FIG. 3A, and thus similar components thereof are indicated with the same reference numerals and have similar functions, and no further detail will be elaborated herein. A main difference between the touch panel 40 and the touch panel 30 lies in that, in addition to the control unit 400 being electrically connected with the first sensing electrodes 210 through the first switches 310 and the first sensing electrodes 210 being electrically connected with the corresponding third sensing electrodes 230 through the fifth switches 350, the control unit 400 may also be electrically connected with the second sensing electrodes 220 through the second switches 320, and be electrically connected with the fourth sensing electrodes 240 through the fourth switches 340.

In detail, in the present embodiment, the control unit 400 is electrically connected with the first sensing electrodes 210 through the first switches 310, the control unit 400 is electrically connected with one of the adjacent third sensing electrodes 230 of each of the first sensing electrodes 210 through each of the first switches 310 and each of the fifth switches 350, the control unit 400 is electrically connected with the second sensing electrodes 220 through the second switches 320, and the control unit 400 is electrically connected with the fourth sensing electrodes 240 through the fourth switches 340. On the other hand, the third sensing electrodes 230 are not electrically connected with the control unit 400 through the third switches 330, and the fourth sensing electrodes 240 are not electrically connected with the second sensing electrodes 220 through the sixth switches 360. As a result, the control unit 400 of the touch apparatus 40 may locate the coordinates whereby the conductive object approaches or contacts the touch apparatus 40 through capacitance changes between the first sensing electrodes 210 and one of the third sensing electrodes 230 adjacent thereto and the second sensing electrodes 220, and through capacitance changes between one of the first sensing electrodes 210 and one of the third sensing electrodes 230 adjacent thereto and the fourth sensing electrodes 240. Otherwise, the control unit 400 of the touch apparatus 40 may locate the coordinates whereby the conductive object approaches or contacts the touch apparatus 40 through the respective capacitance changes in each of the first sensing electrodes 210 and one of the third sensing electrodes 230 adjacent thereto, in each of the second sensing electrodes 220, and in each of the fourth sensing electrodes 240.

Figure 4B:
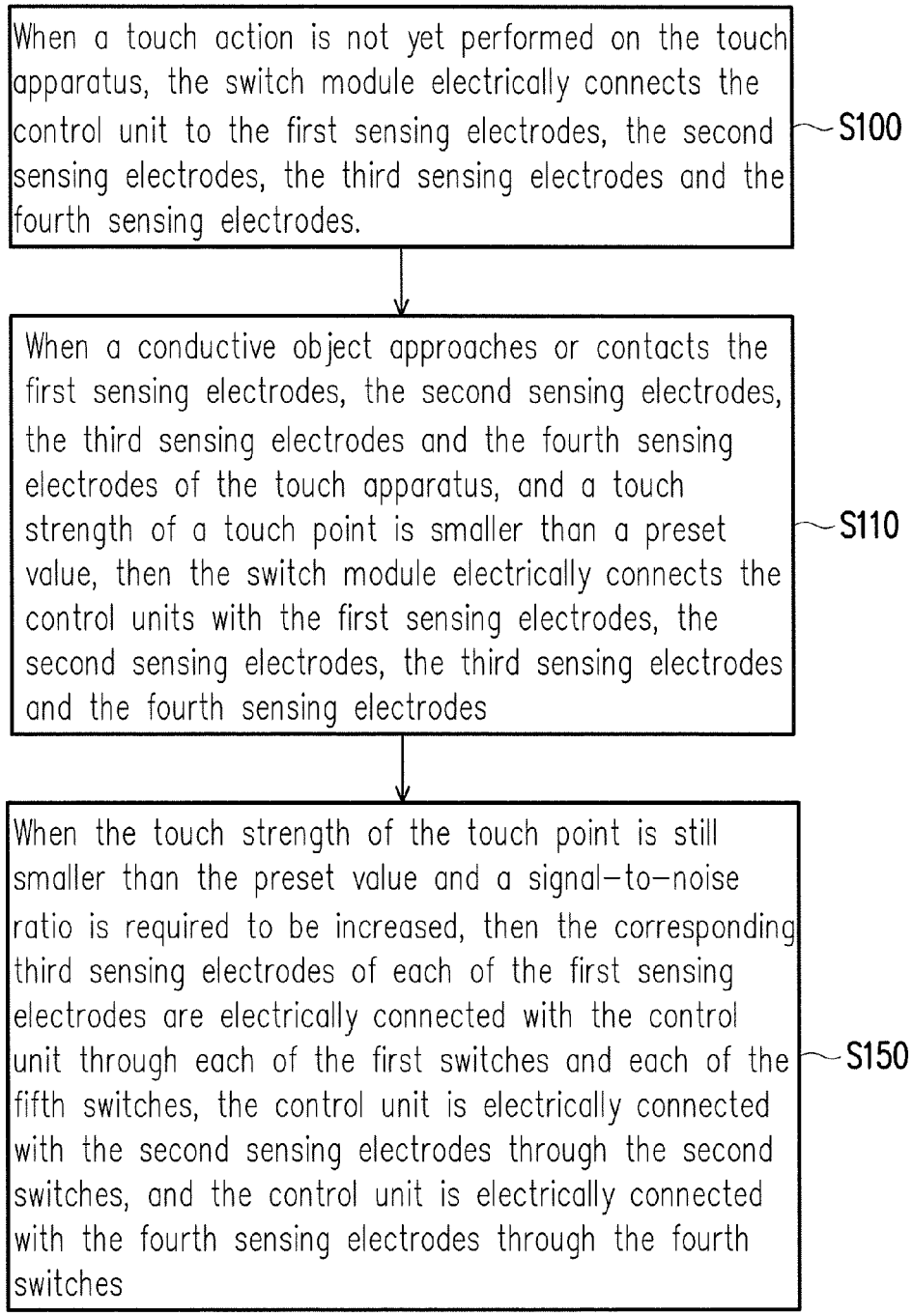
FIG. 4B shows a sensing method suitable for the touch apparatus depicted in FIG. 4A.

On the other hand, FIG. 4B shows a sensing method suitable for the touch apparatus depicted in FIG. 4A. Referring to FIG. 4A and FIG. 4B, in general, when a touch action is not yet performed on the touch apparatus 40, such as in step S100, the switch module 300 electrically connects the control unit 400 with the first sensing electrodes 210, the second sensing electrodes 220, the third sensing electrodes 230 and the 240 fourth sensing electrodes. In the present embodiment, when the touch action is performed on the touch apparatus 40, such as in step S110, a touch strength of a touch point on the touch apparatus 40 may be determined through sensing the capacitance changes between the first sensing electrodes 210, the third sensing electrodes 230, the second sensing electrodes 220 and the fourth sensing electrodes 240, or through sensing the respective capacitance changes in each of the first sensing electrodes 210, in each of the second sensing electrodes 220, in each of the third sensing electrodes 230 and in each of the fourth sensing electrodes 240. Next, the touch strength of the touch point in comparison to a preset value is being determined. When the touch strength of the touch point is smaller than the preset value, such as in step S110, the switch module 300 electrically connects the control unit 400 with the first sensing electrodes 210, the second sensing electrodes 220, the third sensing electrodes 230 and the fourth sensing electrodes 240. And, if under the above condition, the touch strength of the touch point is still smaller than the preset value, such as in step S150, and in order to further increase a signal-to-noise ratio (SNR), then the switch module 300 electrically connects the corresponding third sensing electrodes 230 of each of the first sensing electrodes 210 with the control unit 400 through each of the first switches 310 and each of the fifth switches 350, electrically connects the control unit 400 with the second sensing electrodes 220 through the second switches 320, and electrically connects the control unit 400 with the fourth sensing electrodes 240 through the fourth switches 340.

For instance, in the touch apparatus 40, a spacing between the first sensing electrodes 210 and the third sensing electrodes 230 that are staggeredly disposed with each other along a first direction D1 may be designed to range from 2 µm to 3.5 µm, and a spacing between the second sensing electrodes 220 and the fourth sensing electrodes 240 that are staggeredly disposed with each other along a second direction D2 may be designed to range from 2 µm to 3.5 µm. Therefore, when using a conductive object, such as a finger in a glove, to approach or contact the first sensing electrodes 210, the second sensing electrodes 220, the third sensing electrodes 230 and the fourth sensing electrodes 240 of the touch apparatus 40, and now, assuming an area of a touch point formed on the touch apparatus 40 being greater than a preset area, while the control unit 400 sensed that the capacitance changes in the first sensing electrodes 210, the second sensing electrodes 220, the third sensing electrodes 230 and the fourth sensing electrodes 240 are smaller than a preset value, then the switch module 300 electrically connects the control unit 400 with the first sensing electrodes 210 and the second sensing electrodes 220, one of the adjacent third sensing electrodes 230 of each of the first sensing electrodes 210 is electrically connected with the control unit 400 through each of the fifth switches 350 and each of the first switches 310, and the fourth sensing electrodes 240 are electrically connected with the control unit 400 through the fourth switches 340, thereby attaining a favorable effect in determining touch coordinates.

Moreover, in the touch apparatus of the invention, the first sensing electrodes 210, the second sensing electrodes 220, the third sensing electrodes 230 and the fourth sensing electrodes 240 may be manufactured with the same optical mask as the display panel. For instanced, the sensing electrodes of the touch apparatus may be manufactured as being overlapped with signal lines, data lines or conductive patterns of common electrodes, and may locate the coordinates whereby the conductive object approaches or contacts the touch apparatus through the capacitance changes therebetween or through the capacitance change in each of the sensing electrodes.

In summary, with the configuration of the switch module between the control unit and the sensing electrodes, the invention enables the user to adjust the connection mode of the switch module according to sensing requirements, such as a projection area of the touch point on the touch apparatus, the touch strength being sensed at the touch point, an enhancement of the signal-to-noise ratio and so forth, and thereby attains the favorable effect in determining touch coordinates.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch apparatus, comprising:
  a substrate;
  a plurality of first sensing electrodes and a plurality of third sensing electrodes, extendedly disposed on the substrate along a first direction, the first sensing electrodes and the third sensing electrodes being staggeredly disposed with each other;
  a plurality of second sensing electrodes and a plurality of fourth sensing electrodes, extendedly disposed on the substrate along a second direction, the second sensing electrodes and the fourth sensing electrodes being staggeredly disposed with each other, and the first direction and the second direction intersecting each other;
  a switch module, electrically connected with the first sensing electrodes, the second sensing electrodes, the third sensing electrodes and the fourth sensing electrodes; and
  a control unit, electrically connected with the switch module for controlling the switch module, and selectively connecting with the first sensing electrodes, the second sensing electrodes, the third sensing electrodes and the fourth sensing electrodes electrically through the switch module, the switch module comprising a plurality of first switches, a plurality of second switches, a plurality of third switches, a plurality of fourth switches, a plurality of fifth switches and a plurality of sixth switches, the first switches being between the control unit and the first sensing electrodes, the second switches being between the control unit and the second sensing electrodes, the third switches being between the control unit and the third sensing electrodes, the fourth switches being between the control unit and the fourth sensing electrodes, the fifth switches being between the first sensing electrodes and the corresponding third sensing electrodes, and the sixth switches being between the second sensing electrodes and the corresponding fourth sensing electrodes, wherein the touch apparatus controls the switch module based on a touch strength, quantified with capacitance, of a touch point on the touch apparatus, when the touch strength of the touch point is smaller than a preset value, the switch module electrically connects the control unit to the first sensing electrodes through the first switches, to the second sensing electrodes through the second switches, to the third sensing electrodes through the third switches, and to the fourth sensing electrodes through the fourth switches, and if the touch strength of the touch point is still smaller than the preset value, then the corresponding third sensing electrodes of each of the first sensing electrodes are electrically connected with the control unit through each of the first switches and each of the fifth switches, and the corresponding fourth sensing electrodes of each of the second sensing electrodes are electrically connected with the control unit through each of the second switches and each of the sixth switches.

2. The touch apparatus as recited in claim 1, wherein the touch strength of the touch point is related to a contact area between the touch point and the touch apparatus.

3. A touch apparatus, comprising:
a substrate;
a plurality of first sensing electrodes and a plurality of third sensing electrodes, extendedly disposed on the substrate along a first direction, the first sensing electrodes and the third sensing electrodes being staggeredly disposed with each other;
a plurality of second sensing electrodes and a plurality of fourth sensing electrodes, extendedly disposed on the substrate along a second direction, the second sensing electrodes and the fourth sensing electrodes being staggeredly disposed with each other, and the first direction and the second direction intersecting each other;
a switch module, electrically connected with the first sensing electrodes, the second sensing electrodes, the third sensing electrodes and the fourth sensing electrodes; and
a control unit, electrically connected with the switch module for controlling the switch module, and selectively connecting with the first sensing electrodes, the second sensing electrodes, the third sensing electrodes and the fourth sensing electrodes electrically through the switch module, the switch module comprising a plurality of first switches, a plurality of second switches, a plurality of third switches, a plurality of fourth switches and a plurality of fifth switches, the first switches being between the control unit and the first sensing electrodes, the second switches being between the control unit and the second sensing electrodes, the third switches being between the control unit and the third sensing electrodes, the fourth switches being between the control unit and the fourth sensing electrodes, and the fifth switches being between the first sensing electrodes and the corresponding third sensing electrodes, wherein the touch apparatus controls the switch module based on a touch strength, quantified with capacitance, of a touch point on the touch apparatus, when the touch strength of the touch point is smaller than a preset value, the switch module electrically connects the control unit to the first sensing electrodes through the first switches, to the second sensing electrodes through the second switches, to the third sensing electrodes through the third switches, and to the fourth sensing electrodes through the fourth switches, and if the touch strength of the touch point is still smaller than the preset value and a signal-to-noise ratio is required to be increased, then the corresponding third sensing electrodes of each of the first sensing electrodes are electrically connected with the control unit through each of the first switches and each of the fifth switches, the control unit is electrically connected with the second sensing electrodes through the second switches, and the control unit is electrically connected with the fourth sensing electrodes through the fourth switches.

4. The touch apparatus as recited in claim 3, wherein the touch strength of the touch point is related to a contact area between the touch point and the touch apparatus.

* * * * *